United States Patent [19]

Loving, Jr. et al.

[11] 4,384,165
[45] May 17, 1983

[54] RADIO FREQUENCY SHIELD WITH FORCE MULTIPLIER INTERCONNECTION FINGERS FOR AN ELECTROMAGNETIC GASKET

[75] Inventors: Robert O. Loving, Jr., Streamwood; Thaddeus J. Zakrzewski, Chicago; Robert B. Stedman, Algonquin; Daryl F. Osberg, Hoffman Estates, all of Ill.

[73] Assignee: Motorola, Inc., Schaumburg, Ill.

[21] Appl. No.: 301,793

[22] Filed: Sep. 14, 1981

[51] Int. Cl.³ .............................................. H05K 9/00
[52] U.S. Cl. ............................. 174/35 GC; 339/95 R
[58] Field of Search .......... 174/35 GC, 35 R, 35 MS; 455/300, 301; 339/95 R, 95 A, 96, 97 R, 98; 330/68; 361/424; 336/84 R, 84 C, 84 M; 331/67

[56] References Cited

U.S. PATENT DOCUMENTS

| | | | |
|---|---|---|---|
| 1,765,443 | 6/1930 | Peterson | 174/35 GC |
| 2,317,813 | 4/1943 | Schoenborn | 174/35 GC |
| 2,844,644 | 7/1958 | Soule, Jr. | 174/35 GC |
| 3,277,230 | 10/1966 | Stickney et al. | 174/35 GC |
| 3,296,356 | 1/1967 | McAdams | 174/35 GC |
| 3,304,360 | 2/1967 | Hadley et al. | 174/35 GC |
| 3,426,140 | 2/1969 | Templeton | 174/35 GC |
| 3,504,095 | 3/1970 | Roberson et al. | 174/35 GC |
| 3,536,820 | 10/1970 | Stevens | 174/35 GC |
| 3,885,084 | 5/1975 | Kaiserswerth et al. | 174/35 MS |
| 3,904,810 | 9/1975 | Kraus | 174/35 MS |
| 3,962,550 | 6/1976 | Kaiserswerth | 174/35 GC |
| 4,039,741 | 8/1977 | Havens | 174/35 GC |
| 4,056,682 | 11/1977 | Havens et al. | 174/35 GC |

FOREIGN PATENT DOCUMENTS 411688  12/1974  U.S.S.R. ...................... 174/35 GC

Primary Examiner—A. C. Prescott
Assistant Examiner—D. A. Tone
Attorney, Agent, or Firm—John B. Conklin; Donald B. Southard; Edward M. Roney

[57] ABSTRACT

A high frequency RF gasket is disclosed which provides an electromagnetic seal between a first and second piece of a shielding enclosure. The gasket comprises highly resilient finger projections which are attached to and project out along the perimeter of the first enclosure piece. The relative mating arrangement of the gasket, and first and second enclosure piece is such that a small force imposed on said first enclosure piece is resisted by a much larger resistance force along the longitudinal dimension of the highly resilient finger projections as the fingers engage the second enclosure piece. The larger resistance force causes sufficiently high pressure at the point of contact between the finger projections and the second enclosure piece so that the surface of the second enclosure piece yields to the finger projections. Thus reliable electrical contact between the first and second enclosure pieces is obtained by piercing the surface of the second enclosure piece with the finger projection's point of contact with the second enclosure piece.

3 Claims, 10 Drawing Figures

PRIOR ART

AREA OF CONTACT = W × L

RADIO FREQUENCY SHIELD WITH FORCE MULTIPLIER INTERCONNECTION FINGERS FOR AN ELECTROMAGNETIC GASKET

BACKGROUND OF THE INVENTION

The invention generally relates to electromagnetic radiation shielding construction for radio frequency circuitry. More particularly, the invention relates to a means for effectively ground coupling a detachable cover plate for the shield housing of high frequency radio circuitry.

Properly shielding electronic components from electromagnetic radiation has always been a problem in communications circuitry. Providing adequate shielding in MHz and GHz frequencies communications systems with the methods currently used has not proved reliable in light of the advent of circuit miniaturization through integrated circuitry. The shielding is provided by a conductive metal enclosure which is held at a fixed electrical potential. Ordinarily, the enclosure has two portions, the first portion defines the housing for the electronic circuitry. The housing completely encloses the circuitry except for an access opening. The second portion of the enclosure is the cover plate which closes the access opening and thus completely surrounds the circuitry with a electromagnetic shield. In low frequency applications it is only necessary that electrical contact between the cover plate and the housing be made sporadically when the two enclosure pieces are mated. The points of electrical contact along the joint of the cover and housing need only be less than the one-twentieth wavelength of low frequency RF radiaton. At high radio frequencies, (i.e. MHz and GHz) the associated one-twentieth wavelength of an electromagnetic wave becomes sufficiently short so that even a small gap in the electrical and physical connection of two separate pieces of housing can be enough to allow a leak of the high frequency electromagnetic radiation through the shield. At lower RF frequencies, this is not a substantial problem since the one-twentieth wavelengths of the lower RF frequencies are of a physical length such that gaps between good electrical contact points where the two housing parts join are rarely sufficiently large enough to let the relatively long one-twentieth wavelength of low frequency RF to leak through the shield.

One prior art means for connecting two pieces of an enclosure to provide effective low frequency RF shielding involves utilization of the resilient qualities of one of the two enclosure pieces. Usually the first enclosure piece, or housing, is formed of aluminum in a casting process. The second enclosure piece, or access hole cover plate, is preferably stamped out of cold rolled steel. The steel has a characteristic resiliency which is advantageously used to provide a good electrical connection between the two enclosure pieces.

Aluminum is a good conductor which provides a high quality electromagnetic shield when cast into a housing mold. Unfortunately the aluminum surface almost immediately begins to oxidize with the available oxygen in the atmosphere of the housing's environment. This oxidization results in a insulating skin covering the surface of the aluminum housing. The cover plate which covers the access hole in the housing and completes the electromagnetic shield enclosure for the RF circuitry enclosed must have a means for mating with the housing that effectively cuts through the aluminum surface insulating oxide layer. Use of the force resulting from the yield resistance of a resilient material like cold rolled steel has been effective for low frequency RF frequencies. But at high RF frequencies the force from the yield resistance of most materials is not sufficient to give consistent good electrical contact through the oxide layer at points sufficiently close along the housing and cover plate border so as to effectively stop the leakage of the much shorter one-twentieth wavelength radiation of high frequency RF.

Ordinarily, the perimeter of the access hole cover plate includes flange segments which function to attempt sufficient electrical connection through the aluminum housing oxide layer to form a good RF gasket. The flange segments are shaped to produce a force against the mating housing portion of the shielding enclosure in response to the flange segments compression against a part of the housing surface. The line of contact formed by the cold rolled steel flange segments engagement with the interior wall of the cast aluminum housing is not always consistent in its contact and is subject to poor conductivity caused by the flange segment's sporadic ability to cut through the oxide layer on the surface of the cast aluminum.

The flange segments are often cut into multiple finger-like projections. By design, each finger-like projection is hopefully assured to contact the housing in at least one point since each finger-like projection is located on the cover plate such that it must yield against the housing cavity side wall when the two enclosure portions are joined. The number of finger-like projections on each flange segment is directly related to the required closeness of electrical contact points along the area where the housing and cover join. As explained earlier, with lower RF frequencies the gap between cover plate and housing can be relatively large without risking significant radiation leakage. As the frequencies get higher and the wavelengths shorten, the tolerable gap between the points of conduction along the line of contact between the housing and cover plate becomes smaller and smaller. In order to assure the gap lengths remain within acceptable limits the flange segment must be sectioned into more numerous and more closely packed finger-like projections. But as the finger-like projections are made more numerous, they individually are made more narrow. Accordingly, their yield strength decreases, which provides the force by which the finger-like projections press against the housing cavity side wall. Thus their ability to cut through the insulating oxide layer on the aluminum surface is impeded.

Attempts could be made to modify the flange segments and their finger-like projections so that they will provide sufficient force to effectively scrape away the oxide layer at their point of contact with the housing inside wall and thus guarantee adequately closely spaced grounding connections for good shielding at high frequency RF operation. The force by which the finger-like projections press against the inside housing wall is determined by the yield strength of the fingers. One way to increase the yield strength of the finger-like projections would be to increase the thickness of the cover plate. Increasing the thickness of the flange finger-like projections creates manufacturing problems since the thickness of the projections approach the width dimension of the projection. To die stamp out thick and narrow projections from cold rolled steel gives poor results and short die life. Also the force required to cause the thicker projections to yield and allow the cover to fit over the access opening of the housing would increase to a point which the force could no longer be feasibly created by hand pressure alone.

A second prior art means for interconnecting two pieces of an enclosure to provide effective low frequency RF shielding involves the utilization of a conductive non-corrosive mesh, preferrably stainless steel, fitted into a channel formed along the planar shoulder of an access opening in the housing portion of the enclosure. The depth of the channel is not sufficient to totally contain the conductive mesh. Therefore when a flat planar cover plate is placed over the housing access opening, the conductive mesh is compressed into the channel. The purpose of compressing the mesh is to assure good electrical contact between the housing portion of the enclosure and the cover plate of the enclosure.

As with the first mentioned prior art means for interconnection, this compressed mesh method for providing an electrical connection between a housing and a cover plate has characteristics which make its performance unsatisfactory at high RF frequencies. The cover plate is usually a planar sheet of conductive metal, preferably steel. The compressed mesh produces a force against the wall of a cast aluminum housing which will not consistently pierce the oxide layer on the aluminum at points close enough to guarantee the mesh to be a good electromagnetic gasket at high RF frequencies.

Therefore, it is a object of this invention to provide an electrical connection means for two enclosure sections for use as an electromagnetic shield in high frequency RF applications.

It is a further objective of the invention to provide a cover plate for a grounded cast aluminum housing which assures good electrical connection between the housing and the cover plate along the line where the two meet when joined so as to provide an effective electromagnetic shield.

SUMMARY OF THE INVENTION

The present invention provides an electromagnetic gasket for mating pieces of a high frequency RF shield enclosure with an approximate 20 decibel improved performance over known prior art gaskets. The gasket comprises finger projections which project out along the perimeter of one of the two mating pieces of the shield enclosure. Specifically the finger projections are part of the planar cover plate for a shielding housing. The finger projections are at an approximate 25 degree angle with respect to the plane of the cover plate. The finger projections are made, through a stamping process of a highly resilient conductor, preferrably berylium copper.

A force multiplication effect is realized by the relative construction of finger projections, cover plate and housing. An access hole in the shielding housing, over which the cover plate is fitted, has an associated shoulder on the inside walls of the housing which define the access opening. When the cover plate is mated with the housing access opening, the projection fingers engage the housing shoulder. As hand pressure is applied to seat the cover plate, the resilient projection fingers yield laterally reducing their angle relative to the plane of the cover plate as they slide along the shoulder while moving closer to the associated housing side wall. The projection fingers reach the associated side wall before the cover plate is seated on the housing shoulder. Further force applied by hand in an attempt to complete the seating of the cover plate on the housing shoulder causes a large pressure to develop at the tip of each projection finger as it is forced against the aluminum side wall. The resilient projection fingers buckle as the relatively small force applied by hand to the cover plate causes a very high pressure buildup at the tip of the projection fingers. The aluminum side wall yields to the high pressure and allows the tip of the finger projection to pierce through the surface oxide layer of the aluminum side wall. Thus each finger projection guarantees a point of good electrical connection between the cover plate and the housing and thereby eliminates the possibility of electrical contact gaps, which are large enough to let high frequency RF energy pass through the border of the cover plate and housing.

DESCRIPTION OF THE PREFERRED EMBODIMENT

Figure 1:
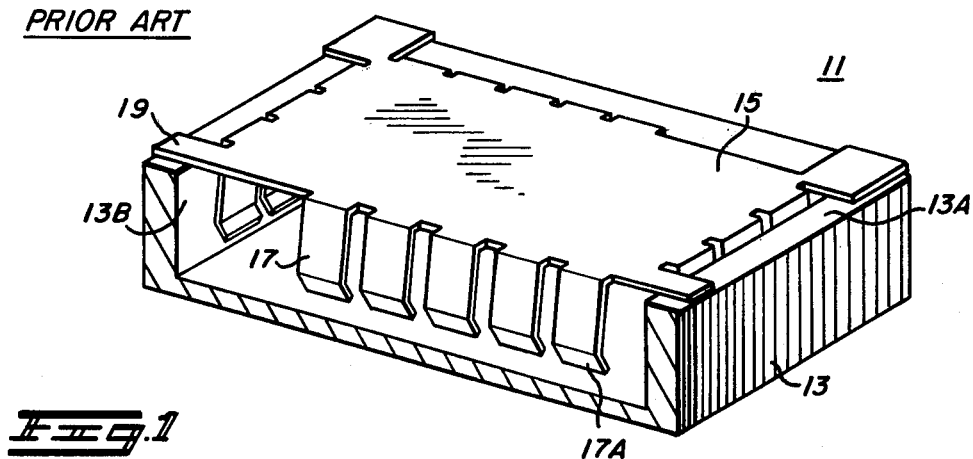
FIG. 1 is a partial cross-sectional view of a first prior art electromagnetic gasket for a cover plate and housing comprising an electromagnetic shield.

FIG. 1 shows a prior art enclosure 11 for use as an electromagnetic shield. The enclosure 11 is defined by a housing 13 and a cover plate 15. The cover plate 15 includes flange projections 17 and co-planar projections 19. The projections 17 are bent at an approximate 90° angle with respect to the plane of cover plate 15. Co-planar projections 19 are an extension of the plane of the cover plate 15 and provide a seat for the cover plate when it engages the housing 13. A shoulder 13a of housing 13 provides the housing with an engagement surface for the cover plate projections 19. Both the housing 13 and the cover plate 15 are constructed of conductive metal, preferrably cast aluminum and cold rolled steel respectively. The flange projections 17 comprise individual fingers which utilize the characteristic resiliency of cold rolled steel to provide a yield force against the housing inside wall 13b.

The flange projections 17 are shaped with an elbow or ridge 17a associated with each finger projection. The circumference of the cover plate 15 as measured from the flange projection elbows 17a defines an associated area slightly larger than the area of the opening in the housing 13 defined by the circumference of the housing inside walls 13b.

Cover 15 is press fitted into the opening defined by the housing inside wall 13b. As the cover 15 is pushed into the opening, each finger of the flange projections 17 yield in a direction lateral to the plane of the cover plate 15. The resistance to yielding and the characteristic resiliency of the cold rolled steel allows each finger to exert and maintain a resistance force against the housing inside walls 13b. This force attempts to assure that each finger of the flange projections 17 is in good electrical contact at some point along the finger's associated elbow 17a. As the cover 15 is pushed deeper into the opening in the housing the co-planar projections 19 come to rest on the housing shoulders 13a. Thus through co-planar projections 19 the cover 15 is abutted against housing shoulders 13a. The width of each finger of flange projection 17 is related to the yield strength of each finger. Each finger of flange projection 17 attempts to provide electrical contact at least at one point along elbow 17a. If each of two adjacent fingers guarantee good contact at only one point along their line of contact with the housing, and the associated electrical gap is too great for higher frequency RF operation, there is a need to move the fingers closer thereby making them more numerous but also decreasing their yield strength. If each finger is made too small the associated reduced yield strength would produce a lateral force against the housing inside walls 13b which would be insufficient to scrape away any built up oxide layer on the aluminum housing inside walls 13b. Therefore, increasing the number of fingers reduces the reliability of close good electrical contact made by each finger instead of enhancing the reliability.

Figure 2:
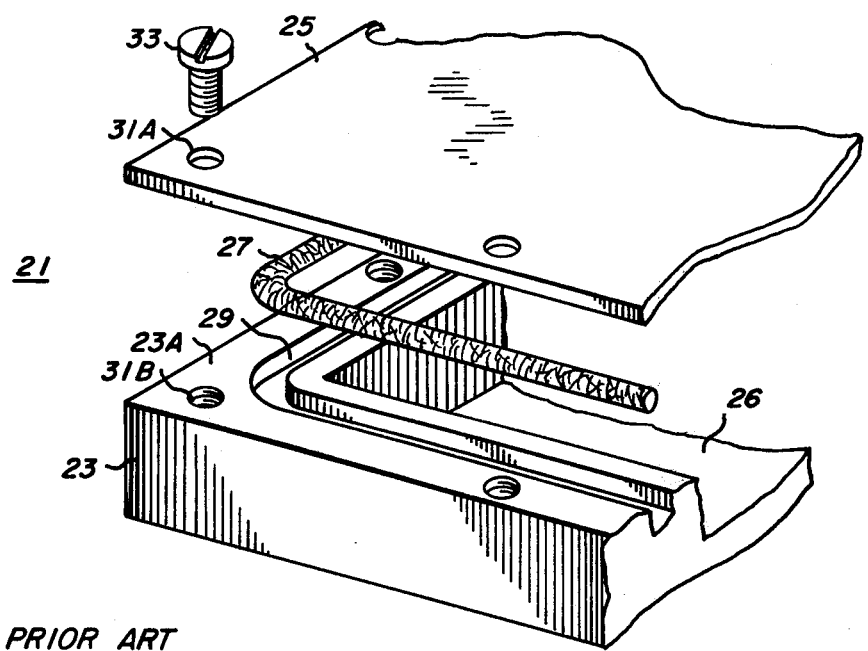
FIG. 2 is an exploded view of a second prior art electromagnetic gasket for a cover plate and housing comprising an electromagnetic shield.

FIG. 2 shows a second prior art method of electrically interconnecting two pieces of an enclosure to form an electromagnetic shield. The enclosure 21 consists of a housing 23 and a flat planar cover plate 25. Most commonly the cover plate 25 is formed by stamping cold rolled steel and the housing 23 is preferably cast of aluminum, but can also be cast of zinc or copper. The housing 23 includes flat planar shoulder 23a along the perimeter of an access opening 26 into the housing 23. The housing shoulder 23a has a channel 27 cut into its surface. A conductive wire mesh 29 is inserted into the channel 27 formed in housing shoulder 23a. The conductive wire mesh 29 is preferably formed of fine gauge stainless steel wire. The cross-sectional area of wire mesh 29 is sufficiently great so that when it is fitted into channel 27 a significant portion of mesh 29 is above the plane defined by housing shoulder 23a. Cover plate 25 is aligned over housing shoulder 23a by mating screw holes 31a in cover plate 25 and mating screw holes 31b in housing shoulder 23a. Screws 33 secured cover plate 25 flush against housing shoulder 23a. The wire mesh 29 is compressed by the flush engagement of cover plate 25 with housing shoulder 23a. The resiliency of the steel wire which makes up the wire mesh 29 produces a yield resisting force against both the cover plate 25 and the channel 27.

In the compressed mesh, the force resulting from the yield strength of the stainless steel wire comprising the mesh, is insufficient to consistently break through the aluminum oxide layer along the entire mesh length. Therefore gaps in good electrical connection are likely between the housing and cover plate which would be large enough to allow leakage of high frequency RF radiation. Adding to this problem is the cover plate's tendency to bow between two points secured to the housing by over tightened screws. The bowing reduces the compression of the mesh and thus reduces the force used to break through the insulating oxide layer on the aluminum housing. Bowing of the planar cover plate can also result from inexact mating with the housing caused by changing temperature and other natural influences. Screws 33 could be more closely spaced in a high frequency application to improve the performance of the wire mesh 29. More closely spacing screws 33 possibly might provide improved performance of the wire mesh 29 but would clearly increase the expense of providing an RF gasket to an undesirable level. Therefore the use of a mesh connection arrangement as a means to provide closely spaced points of electrical contact between the housing and a cover plate in a high RF shield is not satisfactory.

Figure 3A:
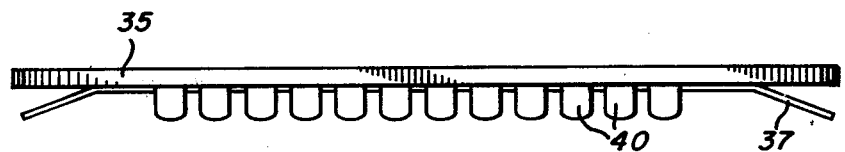
FIG. 3a is a side view of a cover plate with an electromagnetic gasket comprising interconnection fingers according to the invention.
Figure 3B:
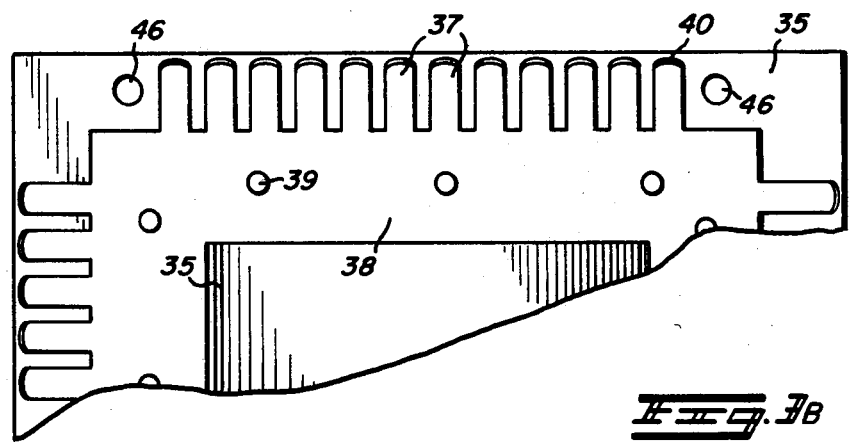
FIG. 3b is a bottom view of the cover plate of FIG. 3a having interconnection fingers according to the invention.

FIGS. 3a and 3b show a side view and bottom view respectively of a cover plate 35 having interconnection fingers 37 according to the invention. The fingers provide a high frequency RF gasket for two joining pieces of an electromagnetic shielding enclosure which results in an approximate 20 decibel improvement in shielding over the prior art means for interconnection shown in FIGS. 1 and 2. In FIG. 3a the cover plate 35 is preferably planar and stamped from cold rolled steel. The interconnection fingers 37 are made of a conductive metal that is highly resilient, preferably berylium copper or spring steel. The interconnection fingers extend from a solid sheet 38 of berylium copper or spring steel which lines the perimeter of the cover plate 35 as can be seen in FIG. 3b. The solid sheet 38 and associated fingers 37 are secured to the cover plate 35 by rivets 39. Each interconnection finger 37 is spaced from an adjacent finger by an amount no greater than the one-twentieth wavelength operating frequency of the device that is to be shielded. The interconnection fingers 37 and solid sheet 38 are formed by a die stamping process. The length of each interconnection finger is such that the tip of its length 40 extends beyond the boundary of the cover plate 35 when it is forced flush to the cover plate 35. The determination of the exact dimensions of the interconnection fingers will be discussed in connection with FIG. 5. Screw holes 46 in FIG. 3b provide a means for screws to hold cover plate 35 in full engagement with a mating housing.

Figure 4A:
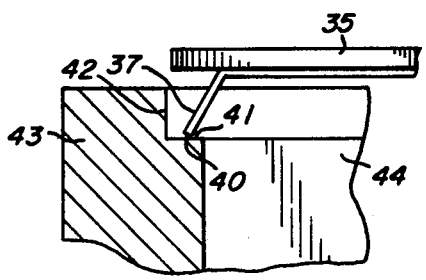
FIG. 4a–4d are a time sequence series of illustrations showing the process by which the fingers on the cover plate of FIGS. 3a and 3b connect with the inside surface of the cover plate's mating housing piece.
Figure 4B:
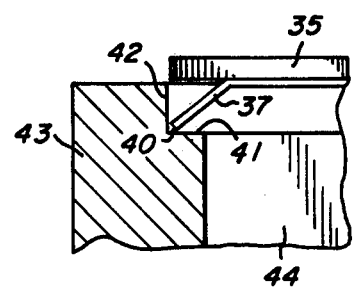
Figure 4C:
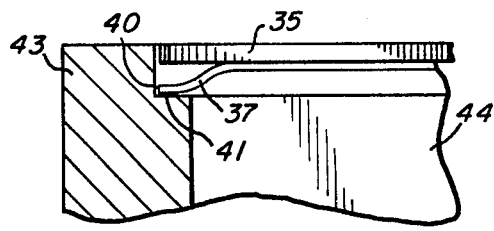
Figure 4D:
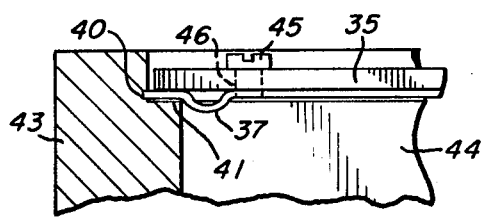

FIGS. 4a through 4d show the sequential steps by which cover plate 35 and its associated interconnection fingers 37 are fitted into a shoulder 41 of a housing 43. The housing 43 is the main portion of the electromagnetic shield. An access opening 44 in the housing 43 is closed by cover plate 35 thereby creating a complete enclosure which can totally shield electromagnetic radiation. The housing is formed of conductive material, preferrably cast aluminum. FIG. 4a shows the initial placement of cover plate 35 and its associated interconnection fingers 37 into the opening of housing 43 defined by housing shoulders 41. The interconnection fingers are set at approximately a 25° angle with respect to the plane of cover plate 35 in the preferred embodiment. As a force is applied to the top of cover plate 35 the interconnection fingers yield laterally and slide along shoulder 41 until they are stopped by the housing side wall 42 as shown in FIG. 4b. In the preferred embodiment, as the interconnection fingers are yielding, the 25° angle decreases to a value of approximately 5° when the fingers contact side wall 42. FIG. 4b shows the finger's 37 initial contact with the base section of housing shoulder 41. FIG. 4c illustrates the beginning of the fingers yielding as a force continues to be applied to cover plate 35. The fingers 37 yield along their longitudinal axis in either a concave or convex shape. The final position of cover plate 35 and its associated fingers 37 is illustrated in FIG. 4d. The force along the longitudinal axis of finger 37, which results from the force applied to cover plate 35 and the compression and distortion of the highly resilient material comprising finger 37, causes the finger tip 40 to cut through the oxide layer if any is present on the aluminum surface. The finger tip 40 actually is impressed into the side wall of the aluminum cast housing 43. The finger 37 yields in a concave distortion as shown in FIG. 4d. It should be noted that a finger 37 distortion that starts out as convex will snap or toggle into a concave distortion as the cover plate 35 moves toward its seated position. FIG. 4d shows screw 45 fitted into cover plate screw hole 46 which mates with a threaded bore in the housing 43. A series of screws 46 at appropriately spaced locations along the perimeter of the cover plate 35 serve to hold together the fully mated cover plate 35, interconnection finger 37 and housing 43.

Figure 5A:
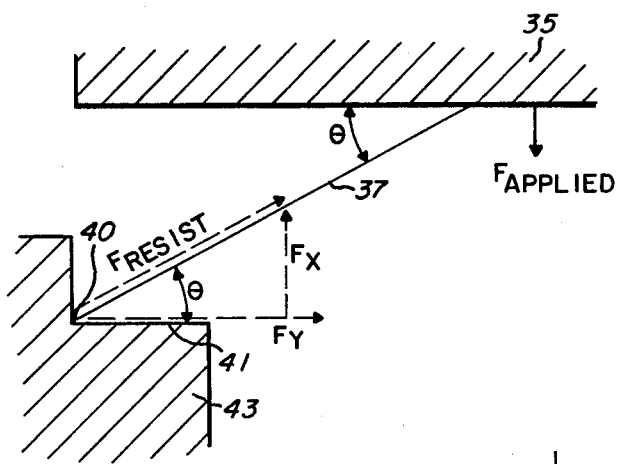
FIG. 5a is a force diagram of the force acting on the cover plate, interconnection fingers and housing according to the invention as the cover plate is mated with the housing.

FIG. 5 illustrates the force multiplication effect realized by the particular construction of the cover plate 35 and the interconnection fingers 37 in relation to the housing 43 and its associated shoulder 41. From FIG. 5a assume the force F (applied) is approximately 0.1 lb./finger which is applied by a human hand pressing on the cover plate 35. At the point of contact between the side wall of housing 43 and the tip 40 of interconnection finger 37 a force F (resist) develops since the side wall resists movement of the interconnection finger 37. In the preferred embodiment the angle $\theta$ of the interconnection finger with respect to the plane of the cover plate when the interconnection finger contacts the housing side wall is approximately 5°.

$$|F\text{ (resist)}| = \sqrt{F_x^2 + F_y^2}$$

$$\left|\frac{F_y}{F_x}\right| = \cot\theta = \text{cotangent } 5°.$$
$$\text{Cotangent } 5° = 11.43$$

$$|F_y| = 11.43\,|F_x|$$

For equilibrium, assume F (applied) has only a x-axis component.

$$F_x = -F\text{ (applied)}$$

$$|F_y| = 11.43\,|F\text{ (applied)}|$$

$$|F_y| = 1.143 \text{ lb.}$$

With a value of 5° for the angle $\theta$ of interconnection fingers 37 when they meet the housing side walls, as measured from the flat plane of cover plate 35, the aluminum housing shoulder 41 must resist the applied horizontal force of 0.1 lb./finger with a force over 11 times as great as the applied force.

Figure 5B:
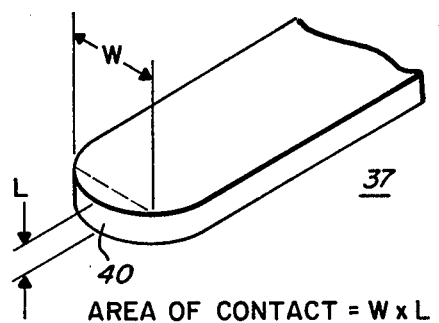
FIG. 5b is a isolated view of a tip of one interconnection finger according to the invention showing the approximate surface area of the tip which contacts the housing side wall when the cover plate and housing are mated.

As can be seen in FIG. 5b. the tips 40 of the interconnection fingers 37 are rounded. The berylium copper or spring steel from which the interconnection fingers 37 and solid sheet 38 are made is approximately 0.005 inches thick in the preferred embodiment. Therefore, the value of L in FIG. 5b is 0.005 inches. Assuming a reasonable value for the width (w in FIG. 5b) of interconnection finger rounded tip 40 which is in contact with the aluminum housing shoulder 42 to be 0.01 inches, then the area of contact of the interconnection finger tip 40 with the aluminum housing shoulder 41 is;

$$W \times L = \text{Area} = 0.00005 \text{ in}^2$$

The pressure along the area of finger 37 in contact with housing shoulder 41 is;

Pressure = Force/area
$P = 1.143 \text{ lb.}/0.00005 \text{ in}^2$
$P = 22,860 \text{ lb./in}^2$ With aluminum yielding at 20,000 lb./in$^2$ an easily applied hand force of 0.1 lb./finger on cover plate 35 is sufficient to create enough pressure at the interconnection finger tip 40 to pierce through the surface oxide layer on the aluminum housing wall.

In the preferred embodiment, the berylium copper which comprises the fingers 37 are highly resilient and can withstand approximately 160,000 psi. It will be apparent to one of ordinary skill in the art that the finger length must be designed with max-min tolerances that will result in both a minimum length long enough to allow the fingers to break the oxide layer yet not so long as to buckle the fingers along their length to a degree creating sufficient stress to permanently set the fingers. Well known strength of materials equations can be used to determine these tolerances of any particular material used for the fingers.

In summary, the interconnection fingers of the invention provide an effective high frequency RF electromagnetic gasket for mating parts of a shield enclosure which improves the shielding performance by approximately 20 decibels.

We claim:

1. An electromagnetic gasket arrangement for mating a first and second piece of an electromagnetic enclosure, said gasket arrangement comprising,
   a first enclosure piece with attached highly resilient finger projections on the periphery of said first enclosure piece,
   a second enclosure piece with side walls and associated shoulders defining an opening that receives said first piece,
   said finger projections having tips which engage said second piece shoulder and side walls when said first piece mates with said second piece such that an engagement force applied to said first piece is resisted by a much greater resisting force along the longitudinal axis of said finger projections, said resisting force causes said finger projection tips to exert a sufficient pressure against said side walls to pierce their surface and thereby provide reliable electrical contact along the mating edges of said first and second enclosure pieces.

2. In an electromagnetic gasket arrangement according to claim 1, the length of said attached highly resilient finger projections is such that said finger projection tips extend beyond the perimeter of said first enclosure piece when said highly resilient finger projections are pressed flush with said first enclosure piece.

3. In an electromagnetic gasket arrangement according to claim 1, said highly resilient finger projections are attached to said first enclosure piece at an angle, with respect to the periphery of the first enclosure piece, that is greater than 0° but less than 90° and such that said highly resilient fingers yield to said engagement force so that the angle is reduced to near zero degrees upon full engagement of said first enclosure piece with said second enclosure piece.

* * * * *